(12) United States Patent
Tsuchiya et al.

(10) Patent No.: US 7,095,613 B2
(45) Date of Patent: Aug. 22, 2006

(54) WATERTIGHT PLATE AND POWER SUPPLY DEVICE INCLUDING THE SAME

(75) Inventors: Takahiro Tsuchiya, Chuo-ku (JP); Atsushi Yakuwa, Chuo-ku (JP)

(73) Assignee: TDK Corporation, Tokyo (JP)

( * ) Notice: Subject to any disclaimer, the term of this patent is extended or adjusted under 35 U.S.C. 154(b) by 190 days.

(21) Appl. No.: 10/806,125

(22) Filed: Mar. 23, 2004

(65) Prior Publication Data
US 2004/0190244 A1 Sep. 30, 2004

(30) Foreign Application Priority Data
Mar. 26, 2003 (JP) .............................. 2003-085661

(51) Int. Cl.
*H05K 7/20* (2006.01)
(52) U.S. Cl. ..................................... 361/699; 165/80.3
(58) Field of Classification Search ................ 361/699, 361/728
See application file for complete search history.

(56) References Cited

U.S. PATENT DOCUMENTS

| | | | | |
|---|---|---|---|---|
| 5,024,503 A | * | 6/1991 | Gunn et al. .................... | 385/53 |
| 5,448,580 A | * | 9/1995 | Birx et al. ................... | 372/38.1 |
| 6,156,970 A | * | 12/2000 | Harting et al. .............. | 174/52.1 |
| 6,166,937 A | | 12/2000 | Yamamura et al. | |
| 2001/0014029 A1 | * | 8/2001 | Suzuki et al. ................ | 363/141 |
| 2003/0053298 A1 | * | 3/2003 | Yamada et al. .............. | 361/728 |

OTHER PUBLICATIONS

Academic Press Dictionary of Science and Technology, Academic Press, 1996, 4 pages.*

* cited by examiner

*Primary Examiner*—Gregory Thompson
(74) *Attorney, Agent, or Firm*—Oliff & Berridge, PLC

(57) ABSTRACT

Provided are a watertight plate where a resin is prevented from leaking and a power supply device including the same. In a base plate (watertight plate) of the present invention, when demarcating a channel by allowing a channel sidewall to contact with a cover plate, a resin is applied onto a second step portion of the channel sidewall to improve watertightness of the channel. The second step portion is closer to the channel and lower than a first step portion, which is a step portion in contact with the cover plate. Therefore, the movement of the resin applied onto the second step portion is prohibited by an edge surface of the step portion higher than the second step portion. Moreover, a resin lump of the resin applied onto the second step portion is housed within a third step portion which is closer to the channel and lower than the second step portion.

15 Claims, 5 Drawing Sheets

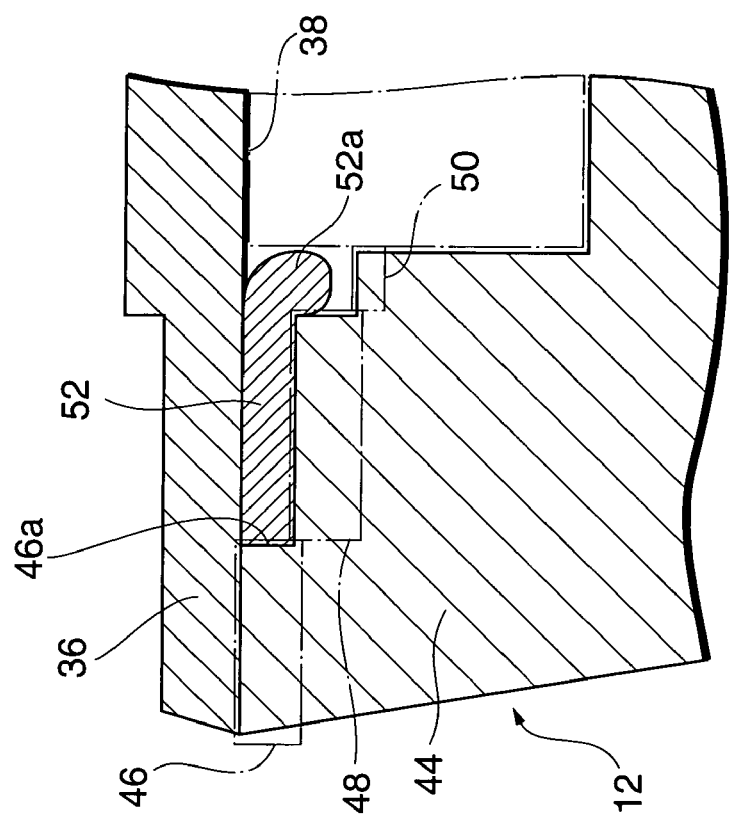
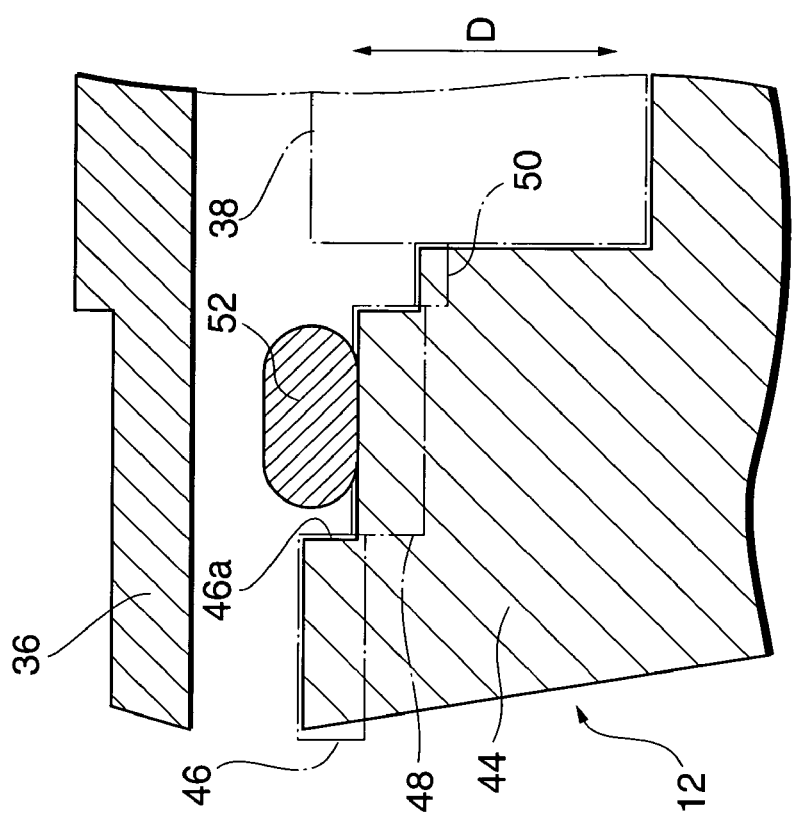

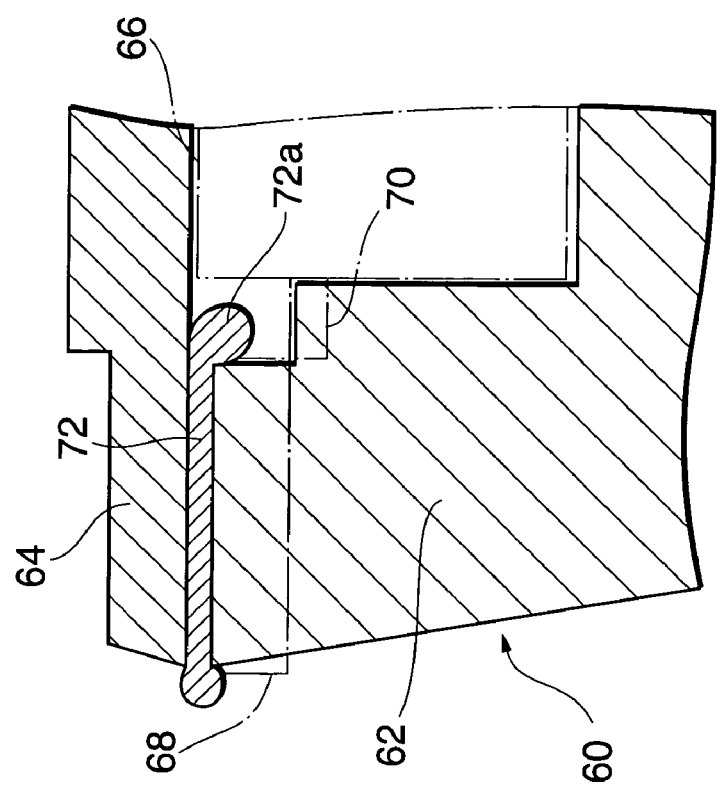
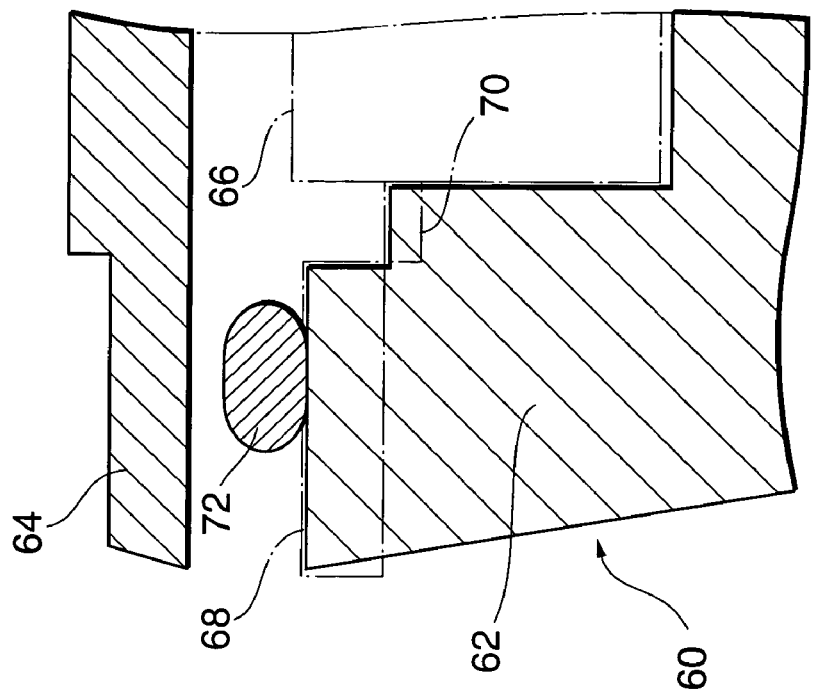

WATERTIGHT PLATE AND POWER SUPPLY DEVICE INCLUDING THE SAME

BACKGROUND OF THE INVENTION

1. Field of the Invention

The present invention relates to a watertight plate which seals a channel and a power supply device including the same.

2. Related Background of the Invention

Conventionally, in this technical field, a structure for sealing a channel has been such a structure as shown in FIGS. 5A and 5B. More specifically, a channel 66 is demarcated by means of a channel sidewall 62 of a watertight plate 60 and a cover plate 64, and on the channel sidewall 62, two step portions 68 and 70 are formed. Moreover, the channel 66 is hermetically sealed as follows: a gasket resin 72 for sealing is applied onto the upper step portion 68 (see FIG. 5A); the cover plate 64 and the watertight plate 60 are press bonded to each other (see FIG. 5B); and then the resin 72 is dried. Note that a resin lump 72a, which has been formed upon the above compression bonding, is housed within the lower step portion 70, which is closer to the channel 66 and lower than the upper step portion 68. Thus, the resin lump 72a is prevented from entering into the channel 66. Moreover, due to the resin lump 72a, stress of water pressure applied by coolant flowing through the channel 66 is distributed, and stress loaded onto the resin 72 interposed between the upper step portion 68 of the watertight plate 60 and the cover plate 64 is reduced.

SUMMARY OF THE INVENTION

However, as shown in FIG. 5B, when the watertight plate 60 and the cover plate 64 are press bonded to each other, the resin 72 is partly pushed out from between the watertight plate 60 and the cover plate 64. If the pushed out portion of the resin 72 is not removed, an operator or an operating machine gets dirty. Moreover, to avoid the operator or the like from getting dirty, a resin removing step is required to be further added, which results in an increase in man-hours.

The present invention is made to solve the foregoing problems. An object thereof is to provide a watertight plate where resin is prevented from leaking, and a power supply device including the same.

A watertight plate according to the present invention is a watertight plate including a channel sidewall which is in contact with a cover plate and demarcates a channel, wherein, on the channel sidewall, formed are: a first step portion in contact with the cover plate; a second step portion which is closer to the channel and lower than the first step portion and is applied with a sealing resin; and a third step portion which is closer to the channel and lower than the second step portion and within which a resin lump of the sealing resin is housed.

In this watertight plate, when demarcating the channel by allowing the channel sidewall to contact with the cover plate, a sealing resin is applied onto the second step portion of the channel sidewall to improve watertightness of the channel. The second step portion is closer to the channel and lower than the first step portion, which is a step portion in contact with the cover plate. Therefore, the movement of the sealing resin applied onto the second step portion is prohibited by an edge surface of the step portion higher than the second step portion. Moreover, a resin lump of the sealing resin applied onto the second step portion is housed within the third step portion which is closer to the channel and lower than the second step portion. In other words, in this watertight plate, a resin lump is formed, and the sealing resin is prevented from being pushed out from between the watertight plate and the cover plate. Note that, in this specification, "lower" means a position closer to the bottom of the channel in view of the depth direction of the channel.

A power supply device according to the present invention is a power supply device including a watertight plate with electronic parts including a switching element, a transformer and a rectifier mounted thereon, the watertight plate having a channel sidewall in contact with a cover plate and demarcating a channel through which a coolant flows for cooling the electronic parts, wherein, on the channel sidewall, formed are: a first step portion in contact with the cover plate; a second step portion which is closer to the channel and lower than the first step portion and is applied with a sealing resin; and a third step portion which is closer to the channel and lower than the second step portion and within which a resin lump of the sealing resin is housed.

In this power supply device, when the channel of the watertight plate is demarcated by allowing the channel sidewall to contact with a cover plate, a sealing resin is applied onto the second step portion of the channel sidewall to improve watertightness of the channel. The second step portion is closer to the channel and lower than the first step portion, which is a step portion in contact with the cover plate. Therefore, the movement of the sealing resin applied onto the second step portion is prohibited by an edge surface of the step portion higher than the second step portion. Moreover, a resin lump of the sealing resin applied onto the second step portion is housed within the third step portion which is closer to the channel and lower than the second step portion. In other words, in this watertight plate of the power supply device, a resin lump is formed, and the sealing resin is prevented from being pushed out from between the watertight plate and the cover plate.

A power supply device according to the present invention is a power supply device including a watertight plate with electronic parts including a switching element, a transformer and a rectifier mounted thereon, the watertight plate having a channel sidewall in contact with a cover plate and demarcating a channel through which a coolant flows for cooling the electronic parts, wherein, on the channel sidewall, formed are: a first step portion in contact with the cover plate; a second step portion which is closer to the channel and lower than the first step portion and is applied with a sealing resin; and a third step portion which is closer to the channel and lower than the second step portion and within which a resin lump of the sealing resin is housed; and the channel is demarcated by applying the sealing resin onto the second step portion of the watertight plate and bringing the cover plate into contact with the first step portion of the watertight plate.

In this power supply device, the channel is demarcated by bringing the first step portion of the channel sidewall of the watertight plate into contact with the cover plate. Note that a sealing resin is applied onto the second step portion of the channel sidewall of the watertight plate to improve watertightness of the demarcated channel. The second step portion is closer to the channel and lower than the first step portion. Therefore, the movement of the sealing resin applied onto the second step portion is prohibited by an edge surface of the step portion higher than the second step portion. Moreover, a resin lump of the sealing resin applied onto the second step portion is housed within the third step portion which is closer to the channel and lower than the second step portion. In other words, in this watertight plate of the power supply device, a resin lump is formed, and the sealing resin is prevented from being pushed out from between the watertight plate and the cover plate.

BRIEF DESCRIPTION OF THE DRAWINGS

FIGS. 4A and 4B are enlarged sectional views of substantial parts which show a state where the base plate and a cover plate are attached to each other.

FIGS. 5A and 5B are views showing a conventional way of hermetically sealing the watertight plate and the cover plate.

DESCRIPTION OF THE PREFERRED EMBODIMENT

Figure 1:
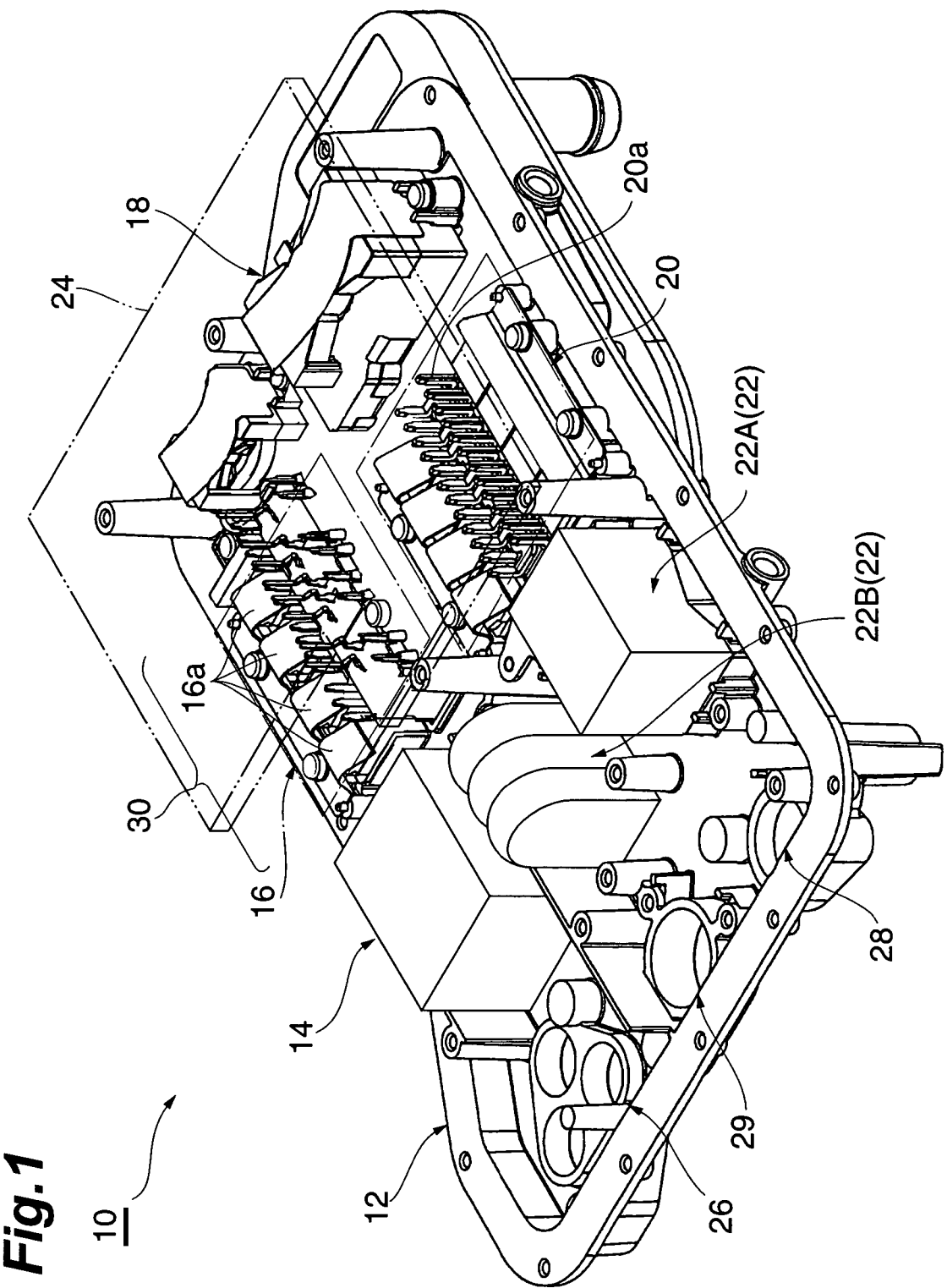
FIG. 1 is a perspective overview of a switching power supply according to an embodiment of the present invention.

A preferred embodiment of a watertight plate according to the present invention will be detailed hereinbelow with reference to the accompanying drawings. Note that the same reference numerals are applied to the same or similar elements, and overlapping explanation thereof will be omitted.

FIG. 1 is a perspective overview of a switching power supply (power supply device) 10 according to an embodiment of the present invention. The switching power supply 10 is a so-called DC—DC converter applied to a hybrid car and the like, and is a device which steps down an input voltage sent from an on-vehicle battery, and stabilizes the voltage to send it out to on-vehicle equipment such as power windows, headlights, and audio equipment, as well as to a motor and the like.

The switching power supply 10 includes, as main components, a base plate (watertight plate) 12, an input smoothing circuit 14 for removing noises of an input voltage, a switching circuit 16 for converting a direct current into an alternating current, a main transformer 18 which performs voltage transformation, a rectifier circuit 20 for converting an alternating current into a direct current, and an output smoothing circuit 22 for removing noises of an output voltage. Moreover, on the base plate, disposed is a control board 24 which mainly controls the switching circuit 16.

Figure 2:
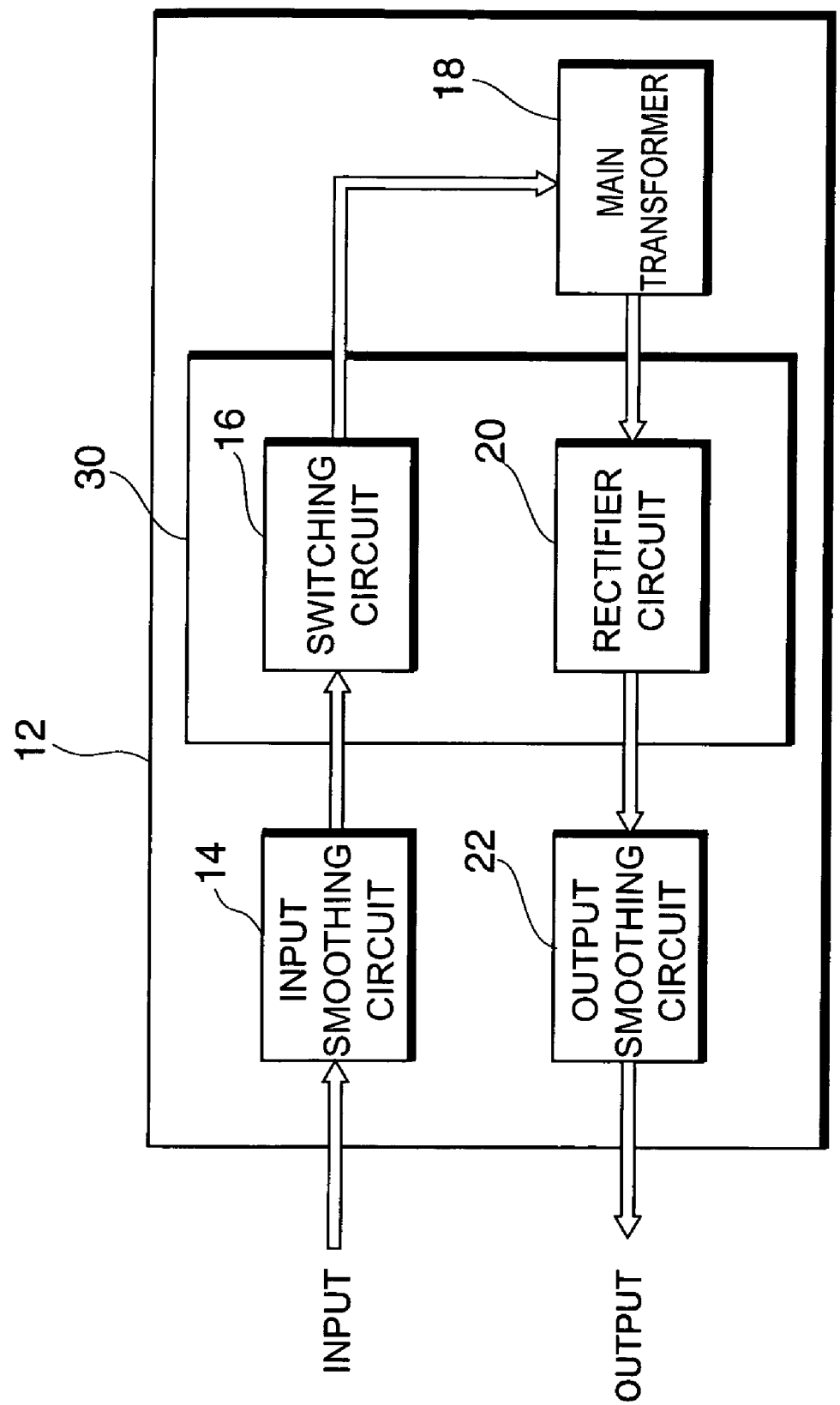
FIG. 2 is a diagram schematically showing a circuit system of the switching power supply of FIG. 1.

Relations among these components will be described with reference to FIG. 2. Note that FIG. 2 is a diagram schematically showing a circuit system of the switching power supply 10. As described above, when the switching power supply 10 receives an input voltage from a battery, noise elements of the input voltage are first removed in the input smoothing circuit 14. The input voltage, from which noises have been removed by the input smoothing circuit 14, is then converted into an alternating voltage in the switching circuit 16. The input voltage converted into an alternating voltage is stepped down in the main transformer 18. The stepped down input voltage is converted into a direct current in the rectifier circuit 20, and outputted after noises thereof are removed in the output smoothing circuit 22. Note that various circuits and elements other than the circuits and the elements shown in FIG. 2 are mounted on the switching power supply 10. However, they are omitted for convenience of explanation.

As shown in FIG. 1, all of the input smoothing circuit 14, switching circuit 16, main transformer (transformer) 18, rectifier circuit 20, and output smoothing circuit 22 are mounted on the base plate. The input smoothing circuit 14 schematically shown essentially includes a coil and a capacitor, which are relatively large elements among those mounted on the base plate 12. The switching circuit 16 includes, for example, four switching elements 16a which are metal-oxide-semiconductor field-effect transistors (MOSFETs). The timing of connecting/disconnecting these switching elements 16a is controlled by the control board 24. To be more specific, two pairs of switching elements 16a are respectively connected/disconnected at a predetermined timing by the control board 24, whereby conversion between a direct current and an alternating current is performed. The main transformer 18 includes a primary coil with more windings and a secondary coil with less windings, and reduces (steps down) an input voltage.

The rectifier circuit 20 includes a plurality of diodes 20a as rectifiers. Note that, not only a chip of rectifier, but also a module of plural rectifiers can be counted as such a rectifier. The output smoothing circuit 22 is made up of a choke coil 22A and a capacitor 22B, which are relatively large elements among those mounted on the base plate 12.

On one end of the base plate 12, input cable holes 26, an output cable hole 28, and a signal cable hole 29 are provided, and, into these holes, unillustrated input cables, an output cable, and a signal cable are installed, respectively. Thus, the input cables and the output cable are gathered in one end of the base plate 12 and connected thereto. A voltage inputted from this end is turned at the main transformer 18 placed at the opposite end and returns back to the above end to be outputted therefrom. Moreover, between the input cable holes 26 and the main transformer 18, the input smoothing circuit 14 and the switching circuit 16 are disposed in this order when viewed from the input cable holes 26. Further, between the main transformer 18 and the output cable hole 28, the rectifier circuit 20 and the output smoothing circuit 22 are disposed in this order when viewed from the main transformer 18. The region including the switching circuit 16 and the rectifier circuit 20 within the surface region of the base plate 12 is a pedestal portion 30 higher than surrounding regions. The switching elements 16a of the switching circuit 16 as well as the diodes 20a of the rectifier circuit 20 are disposed on the pedestal portion 30.

Next, with reference to FIG. 3, a description will be given of a channel formed on the opposite side of the base plate 12 shown in FIG. 1.

Figure 3:
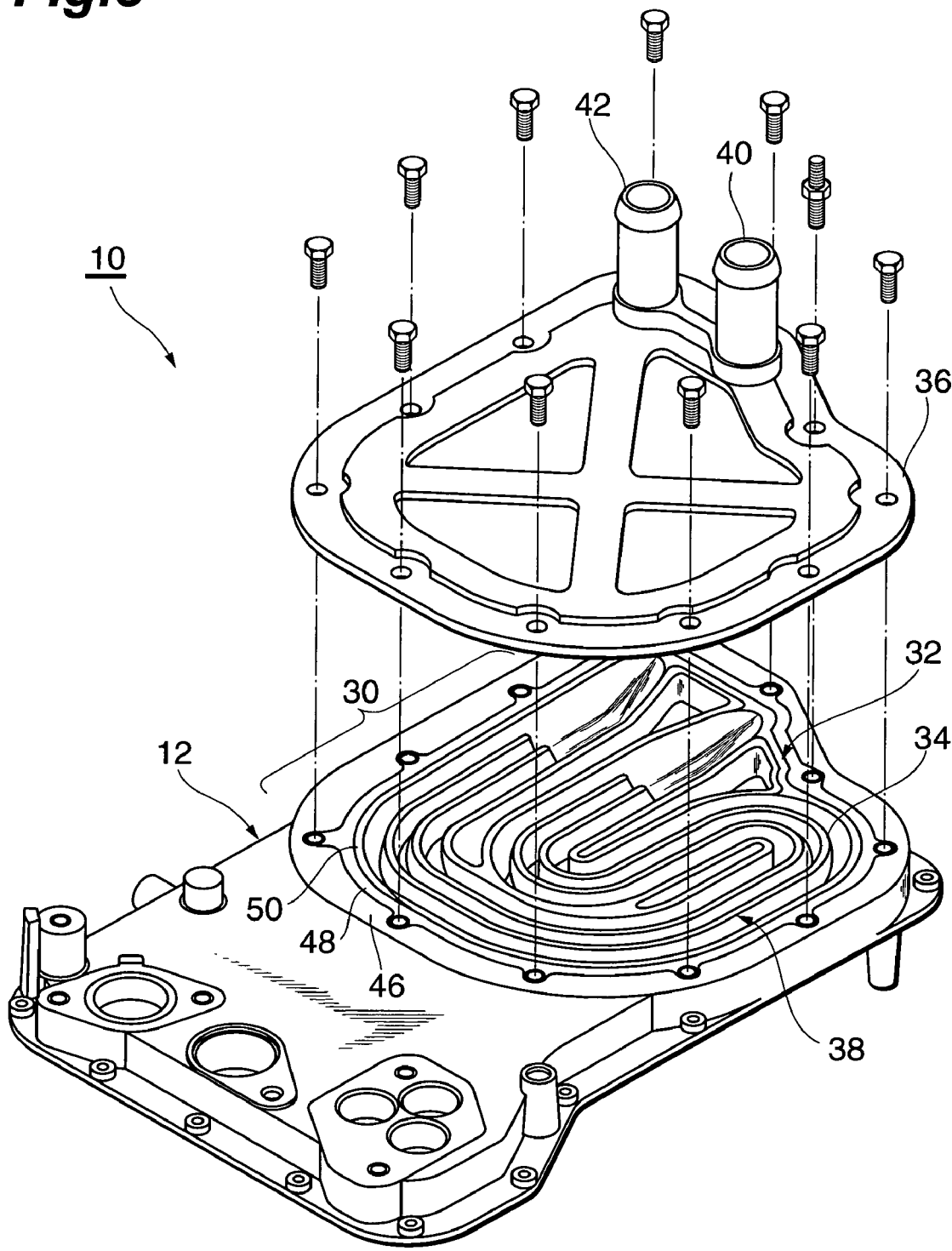
FIG. 3 is a perspective view of the opposite side of a base plate shown in FIG. 1.

FIG. 3 is a perspective view of the opposite side of the base plate 12 shown in FIG. 1. As shown in FIG. 3, the back side of the region where the pedestal portion 30 is formed is recessed, and in this recessed portion 32, a plurality of flexuous fins 34 are integrally provided upright. The fins 34 are provided such that a flow of cooling water is branched into three. In addition, the fins 34 have a plurality of flexures. Therefore, the cooling water (coolant) is thoroughly flown within the recessed portion 32.

Moreover, on the back side of the base plate 12, a flat cover plate 36 is attached by use of screws such that the opening portion of the recessed portion 32 is covered. The cover plate 36 is attached without a space to the end portions of the fins 34 in the recessed portion 32, and a channel 38 is demarcated by the cover plate 36 and the recessed portion 32. On the cover plate 36, an inlet pipe 40 through which cooling water is flown into the channel 38, and an outlet pipe 42 through which cooling water is flown out of the channel 38, are integrally molded. The inlet pipe 40 and the outlet pipe 42 are extended in a direction of a normal of the cover plate 36, and unillustrated hoses are attached to the ends thereof.

Next, a description will be given of connection between the cover plate 36 and the base plate 12 with reference to FIGS. 4A and 4B. FIGS. 4A and 4B are enlarged sectional views of substantial parts which show a state where the base plate 12 and the cover plate 36 are connected to each other. As shown in FIGS. 4A and 4B, three step portions 46, 48 and 50 are formed on a channel sidewall 44 of the base plate 12. The channel sidewall 44 demarcates the outer periphery of the channel 38. Specifically, the first step portion 46 which is the uppermost step portion and is in contact with the cover plate 36, the second step portion 48 lowered one step down from the first step portion 46 toward the channel 38, and the third step portion 50 lowered one step down from the second step portion 48 toward the channel 38, are formed on the channel sidewall 44. In other words, on the channel sidewall 44, the first step portion 46, second step portion 48, and third step portion 50 are formed in this order from a shallow side of the depth direction of the channel 38 (D direction of FIG. 4A).

To press bond the cover plate 36 and the base plate 12, a resin (sealing resin) 52 for sealing is applied onto the second step portion 48 among the three step portions 46, 48 and 50 (see FIG. 4A). The resin 52 is, for example, a silicone resin or the like, and specifically a liquid gasket made of a silicone resin. When the cover plate 36 and the base plate 12 are press bonded to each other, the resin 52 is pressed and extended along the upper surface of the step portion 48. At this time, the resin 52 extended toward the channel 38 hangs down and is housed within the third step portion 50, thus forming a resin lump 52a. Meanwhile, the resin 52 extended in the opposite direction of the channel 38 hits an edge surface 46a of the first step portion 46, and is thus prevented from going further out (see FIG. 4B).

In this way, according to the base plate 12 having such step portions 46, 48 and 50, the resin 52 is prevented from being pushed out from between the base plate 12 and the cover plate 36. Consequently, an operator and an operating machine that perform compression bonding of the cover plate 36 and the base plate 12 do not get dirty, and the resin 52 is prevented from leaking to interfere with adhering work. Moreover, man-hours will not be increased since there is no need to further add a step of removing the resin 52.

Moreover, watertightness of the channel 38, which is demarcated by the base plate 12 and the cover plate 36, is improved due to the resin 52 interposed between the base plate 12 and the cover plate 36. Thus, water leakage is prevented. Further, since the resin lump 52a is housed within the third step portion 50, the resin lump 52a does not drop off to flow into the channel 38. Furthermore, stress loaded onto the resin 52 interposed between the second step portion 48 and the cover plate 36 is reduced attributable to the resin lump 52a, whereby high watertightness of the resin 52 is maintained.

The present invention is not limited to the foregoing embodiment, and various modifications can be made therefor. For example, the number of step portions formed on the channel sidewall is not limited to three, and it may be four or more.

What is claimed is:

1. A watertight plate including a unitary channel sidewall which is in contact with a cover plate to demarcate a channel,
   wherein, on the unitary channel sidewall at least three steps are formed, including:
   a first step portion in contact with the cover plate;
   a second step portion which is closer to the channel and lower than the first step portion and is applied with a sealing resin; and
   a third step portion which is closer to the channel and lower than the second step portion and within which a resin lump of the sealing resin is housed.

2. A power supply device including a watertight plate with electronic parts including a switching element, a transformer and a rectifier mounted thereon, said watertight plate having a unitary channel sidewall in contact with a cover plate and demarcating a channel through which a coolant flows for cooling said electronic parts,
   wherein, on the channel sidewall, at least three steps are formed, including:
   a first step portion in contact with the cover plate;
   a second step portion which is closer to the channel and lower than the first step portion and is applied with a sealing resin; and
   a third step portion which is closer to the channel and lower than the second step portion and within which a resin lump of the sealing resin is housed.

3. A power supply device including a watertight plate with electronic parts including a switching element, a transformer and a rectifier mounted thereon, said watertight plate having a unitary channel sidewall in contact with a cover plate and demarcating a channel through which a coolant flows for cooling said electronic parts,
   wherein, on the unitary channel sidewall, at least three steps are formed, including: a first step portion in contact with the cover plate; a second step portion which is closer to the channel and lower than the first step portion and is applied with a sealing resin; and a third step portion which is closer to the channel and lower than the second step portion and within which a resin lump of the sealing resin is housed; and
   the channel is demarcated when the sealing resin is applied onto the second step portion of the watertight plate and the cover plate is brought into contact with the first step portion of the watertight plate.

4. The watertight plate of claim 1, wherein the cover plate is in direct contact with the first step portion.

5. The watertight plate of claim 1, wherein the sealing resin contacts the cover plate only above the second step portion and the third step portion.

6. The watertight plate of claim 1, wherein a top surface of the first step portion, a top surface of the second step portion, and a top surface of the third step portion are substantially parallel to each other.

7. The watertight plate of claim 1, wherein the channel accommodates a flow of fluid and the resin lump prevents the fluid from contacting an area between the first step portion and the cover plate.

8. The power supply device of claim 2, wherein the cover plate is in direct contact with the first step portion.

9. The power supply device of claim 2, wherein the sealing resin contacts the cover plate only above the second step portion and the third step portion.

10. The power supply device of claim 2, wherein a top surface of the first step portion, a top surface of the second step portion, and a top surface of the third step portion are substantially parallel to each other.

11. The power supply device of claim 2, wherein the channel accommodates a flow of fluid and the resin lump prevents the fluid from contacting an area between the first step portion and the cover plate.

12. The power supply device of claim 3, wherein the cover plate is in direct contact with the first step portion.

13. The power supply device of claim 3, wherein the sealing resin contacts the cover plate only above the second step portion and the third step portion.

14. The power supply device of claim 3, wherein a top surface of the first step portion, a top surface of the second step portion, and a top surface of the third step portion are substantially parallel to each other.

15. The power supply device of claim 3, wherein the channel accommodates a flow of fluid and the resin lump prevents the fluid from contacting an area between the first step portion and the cover plate.

* * * * *